(12) United States Patent
Klein et al.

(10) Patent No.: US 7,610,555 B2
(45) Date of Patent: *Oct. 27, 2009

(54) HAND HELD REMOTE CONTROL DEVICE HAVING AN IMPROVED USER INTERFACE

(75) Inventors: Sandro David Klein, Cypress, CA (US); Ingvald Alain Smith-Kielland, Diamond Bar Boulevard, CA (US); Alex Louie, Los Angeles, CA (US); Cheryl Scott, Newport Beach, CA (US); Wayne Scott, Newport Beach, CA (US)

(73) Assignee: Universal Electronics, Inc., Cypress, CA (US)

( * ) Notice: Subject to any disclaimer, the term of this patent is extended or adjusted under 35 U.S.C. 154(b) by 316 days.

This patent is subject to a terminal disclaimer.

(21) Appl. No.: 11/491,588

(22) Filed: Jul. 24, 2006

(65) Prior Publication Data

US 2006/0259864 A1 Nov. 16, 2006

Related U.S. Application Data

(62) Division of application No. 10/290,605, filed on Nov. 8, 2002.

(60) Provisional application No. 60/334,774, filed on Nov. 20, 2001.

(51) Int. Cl.
*G06F 3/00* (2006.01)

(52) U.S. Cl. .................... 715/738; 348/14.05; 348/114; 348/734; 715/740; 345/168; 345/169; 345/156; 345/172; 341/176; 725/40; 725/431

(58) Field of Classification Search ............. 348/14.05, 348/114, 734; 715/738, 740; 345/169, 168, 345/156, 172; 341/176; 725/40, 43
See application file for complete search history.

(56) References Cited

U.S. PATENT DOCUMENTS 4,894,789 A 1/1990 Yee (Continued)

FOREIGN PATENT DOCUMENTS

EP 0561435 A2 9/1993

(Continued)

OTHER PUBLICATIONS

Universal Electronics Inc., Pronto User Guide, 1999, pp. 1-56.

*Primary Examiner*—Kieu Vu
*Assistant Examiner*—Patrick F Riegler
(74) *Attorney, Agent, or Firm*—Greenberg Traurig, LLP

(57) ABSTRACT

A user interface for displaying information to a user of a universal remote control. The user interface displays to the user a list having a plurality of items each being associated with one or more devices that can be controlled using the remote control and, in response to the user selecting one of the plurality of items from the list, the remote control is caused to access at least one command code for transmission to at least one device setup within the remote control as being associated with the user selected one of the plurality of items and, simultaneously, retrieve Web content which has also been associated within the remote control to the user selected one of the plurality of items from a Web content server which retrieved Web content is displayed in a display of the remote control.

12 Claims, 7 Drawing Sheets

U.S. PATENT DOCUMENTS

| | | | |
|---|---|---|---|
| 5,005,084 A | 4/1991 | Skinner | |
| 5,293,357 A | 3/1994 | Hallenbeck | |
| 5,307,055 A | 4/1994 | Baskin et al. | |
| 5,410,326 A | 4/1995 | Goldstein | |
| 5,537,463 A * | 7/1996 | Escobosa et al. | 348/734 |
| 5,565,888 A | 10/1996 | Selker | |
| 5,574,964 A | 11/1996 | Hamlin | |
| 5,635,989 A | 6/1997 | Rothmuller | |
| 5,648,760 A | 7/1997 | Kumar | |
| 5,652,613 A | 7/1997 | Lazarus et al. | |
| 5,671,267 A | 9/1997 | August et al. | |
| 5,710,605 A | 1/1998 | Nelson | |
| 5,724,106 A | 3/1998 | Autry et al. | |
| 5,751,372 A | 5/1998 | Forson | |
| 5,761,606 A | 6/1998 | Wolzien | |
| 5,767,835 A | 6/1998 | Obbink et al. | |
| 5,793,438 A | 8/1998 | Bedard | |
| 5,801,787 A | 9/1998 | Schein et al. | |
| 5,828,419 A | 10/1998 | Bruette et al. | |
| 5,835,864 A | 11/1998 | Diehl et al. | |
| 5,838,775 A | 11/1998 | Montalbano | |
| 5,855,006 A | 12/1998 | Huemoeller et al. | |
| 5,886,697 A | 3/1999 | Naughton et al. | |
| 5,900,875 A | 5/1999 | Haitani et al. | |
| 5,901,366 A | 5/1999 | Nakano et al. | |
| 5,915,026 A | 6/1999 | Mankovitz | |
| 5,956,025 A | 9/1999 | Goulden et al. | |
| 5,970,206 A | 10/1999 | Yuen et al. | |
| 5,974,222 A | 10/1999 | Yuen et al. | |
| 6,002,394 A | 12/1999 | Schein et al. | |
| 6,002,450 A | 12/1999 | Darbee et al. | |
| 6,018,372 A | 1/2000 | Etheredge | |
| 6,020,881 A | 2/2000 | Naughton et al. | |
| 6,028,599 A | 2/2000 | Yuen et al. | |
| 6,028,600 A | 2/2000 | Naughton et al. | |
| 6,040,829 A | 3/2000 | Croy et al. | |
| 6,097,441 A | 8/2000 | Allport | |
| 6,104,334 A | 8/2000 | Allport | |
| 6,127,941 A | 10/2000 | Van Ryzin | |
| 6,130,726 A | 10/2000 | Darbee et al. | |
| 6,133,909 A | 10/2000 | Schein et al. | |
| 6,137,549 A | 10/2000 | Rasson et al. | |
| 6,151,059 A | 11/2000 | Schein et al. | |
| 6,172,674 B1 | 1/2001 | Etheredge | |
| 6,177,931 B1 | 1/2001 | Alexander et al. | |
| 6,195,589 B1 | 2/2001 | Ketcham | |
| 6,211,856 B1 | 4/2001 | Choi et al. | |
| 6,219,694 B1 | 4/2001 | Lazaridis et al. | |
| 6,256,019 B1 | 7/2001 | Allport | |
| 6,278,499 B1 | 8/2001 | Darbee et al. | |
| 6,285,357 B1 | 9/2001 | Kushiro et al. | |
| 6,341,374 B2 | 1/2002 | Schein et al. | |
| 6,369,840 B1 | 4/2002 | Barnett et al. | |
| 6,407,779 B1 * | 6/2002 | Herz | 348/734 |
| 6,408,435 B1 | 6/2002 | Sato | |
| 6,437,836 B1 | 8/2002 | Huang et al. | |
| 6,463,463 B1 | 10/2002 | Godfrey et al. | |
| 6,501,516 B1 * | 12/2002 | Clapper | 348/734 |
| 6,532,589 B1 | 3/2003 | Proehl et al. | |
| 6,556,222 B1 | 4/2003 | Narayanaswami | |
| 6,567,984 B1 * | 5/2003 | Allport | 725/110 |
| 6,828,992 B1 * | 12/2004 | Freeman et al. | 715/810 |
| 6,859,197 B2 * | 2/2005 | Klein et al. | 345/158 |
| 6,862,741 B1 * | 3/2005 | Grooters | 725/39 |
| 6,882,299 B1 * | 4/2005 | Allport | 341/176 |
| 6,938,101 B2 * | 8/2005 | Hayes et al. | 710/5 |
| 7,102,688 B2 * | 9/2006 | Hayes et al. | 348/465 |
| 7,143,214 B2 * | 11/2006 | Hayes et al. | 710/72 |
| 7,283,059 B2 * | 10/2007 | Harris et al. | 340/825.69 |
| 7,428,023 B2 * | 9/2008 | Allen et al. | 348/734 |
| 2002/0008789 A1 * | 1/2002 | Harris et al. | 348/734 |
| 2002/0143805 A1 * | 10/2002 | Hayes et al. | 707/500 |
| 2002/0149705 A1 * | 10/2002 | Allen et al. | 348/734 |
| 2002/0162120 A1 * | 10/2002 | Mitchell | 725/135 |
| 2002/0180807 A1 * | 12/2002 | Dubil et al. | 345/840 |
| 2002/0190956 A1 * | 12/2002 | Klein et al. | 345/169 |
| 2003/0035074 A1 * | 2/2003 | Dubil et al. | 348/734 |

FOREIGN PATENT DOCUMENTS

| | | |
|---|---|---|
| EP | 0967797 A2 | 12/1999 |
| EP | 0987888 A1 | 3/2000 |
| EP | 1204275 A2 | 5/2002 |
| GB | 2343073 A | 4/2000 |
| WO | WO 00/40016 | 7/2000 |
| WO | WO 00/58935 | 10/2000 |
| WO | WO 01/20572 A1 | 3/2001 |
| WO | WO 01/69567 A2 | 9/2001 |

* cited by examiner

HAND HELD REMOTE CONTROL DEVICE HAVING AN IMPROVED USER INTERFACE

RELATED APPLICATIONS

This application is a divisional of U.S. application Ser. No. 10/290,605 filed on Nov. 8, 2002 which, in turn, claims benefit to U.S. Provisional Patent Application 60/334,774 filed on Nov. 20, 2001 each of which is hereby incorporated by reference in its entirety.

BACKGROUND OF THE INVENTION

This invention relates generally to hand held electronic devices and, more particularly, relates to a hand held remote control device having an improved user interface.

Universal remote controls for controlling the operation of multiple, diverse home appliances are well known. In this regard, universal remote controls perform a valuable function by consolidating three, four, five, and more remote controls into one device. However, as more remotely controllable appliances enter the homes of consumers and the number of remotely controllable operations increase, the user interface of the universal remote control becomes increasingly more complex. This complexity arises from the need to provide more and more keys which are used to initiate the transmission of the control codes that control the increasing number of operations of the increasing number of home appliances. Disadvantageously, as the user interface of the universal remote control becomes more cluttered, the usability of the universal remote control diminishes. Accordingly, a need exists for a universal remote control having an improved user interface that simplifies the operation of the universal remote control and, as such, the remote operation of consumer appliances.

SUMMARY OF THE INVENTION

In accordance with these needs, the subject invention is directed to a user interface for displaying graphical operational mode information to a user of a universal remote control. The user interface displays to the user in a circular queue arrangement iconic representations of home appliances which the universal remote control is setup to control. The user may then interact with the user interface to select an iconic representation of the one of the home appliances which the user desires to control. In response to this selection, the user interface will display the iconic representation of the home appliances such that the iconic representation of the home appliance indicated by the user is moved to a predetermined position in the circular queue arrangement relative to the remaining iconic representations. The iconic representation of the selected appliance may also be given an appearance distinct from the appearance of the remaining iconic representations within the circular queue arrangement. In this manner, the user interface indicates to the user the current operational mode of the universal remote control.

A better understanding of the objects, advantages, features, properties and relationships of the invention will be obtained from the following detailed description and accompanying drawings which set forth an illustrative embodiment which is indicative of the various ways in which the principles of the invention may be employed.

BRIEF DESCRIPTION OF THE DRAWINGS

For a better understanding of the invention, reference may be had to a preferred embodiment shown in the following drawings in which.

DETAILED DESCRIPTION

Figure 1:
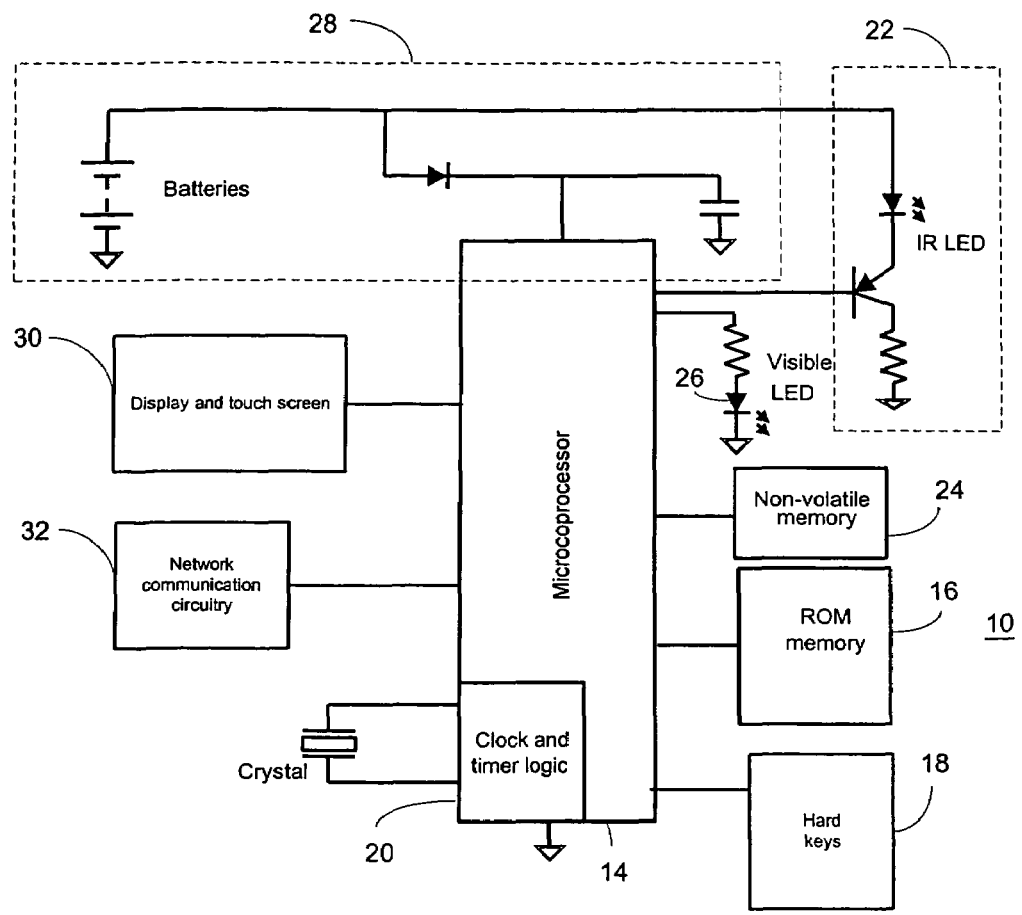
FIG. 1 illustrates a block diagram of a platform for a universal remote control constructed in accordance with the subject invention.

Referring now to the figures, wherein like reference numerals refer to like elements, there is illustrated a universal remote control device 10 having an improved graphical user interface 12. As will be appreciated from the description that follows, the graphical user interface 12 is provided to allow a consumer to initiate the transmission of command codes to home appliances. Additionally, the graphical user interface 12 can be used by a consumer to initiate the exchange of information with an external computer, directly or indirectly via a network such as the Internet. To this end, the graphical user interface may include the software necessary, such as a browser, to display to the consumer information that may be received from an external computer. Such a graphical user interface system is described in pending U.S. application Ser. Nos. 09/905,423, 09/905,432, and 09/905,396 (each of which claim priority to U.S. Provisional Patent Application No. 60/264,767 filed on Jan. 29, 2001 and all of which are incorporated herein by reference in their entirety).

The underlying platform for the improved user interface, an example of which is illustrated in FIG. 1, preferably includes a microprocessor 14 coupled to a ROM memory 16, a key matrix 18 in the form of physical buttons, an internal clock and timer 20, a transmission circuit 22, a non-volatile read/write memory 24, a visible LED 26 to provide visual feedback to the user of the universal remote control device 10, a power supply 28, a touch screen display 30, and I/O circuitry 32 for allowing the universal remote control device 10 to exchange communications with an external computer. Representative platforms include, but are not limited to, devices such as Web tablets and/or personal digital assistants ("PDAs") manufactured by Compaq, HP, Palm, Visor, etc.

As will be appreciated, the ROM memory 16 includes executable instructions that are intended to be executed by the microprocessor 14 to control the operation of the universal remote control device 10. In this manner, the microprocessor 14 may be programmed to control the various electronic components within the universal remote control device 10, e.g., to monitor power, to cause the transmission of signals, etc. Meanwhile, the non-volatile read/write memory 24, for example an EEPROM, battery-backed up RAM, "Smart Card," memory stick, or the like, is provided to store user entered setup data and parameters as necessary, software applications, downloaded data, etc. While the memory 16 is illustrated and described as a ROM memory, memory 16 can be comprised of any type of computer-readable media, such as ROM, RAM, SRAM, FLASH, EEPROM, or the like. Preferably, the memory 16 is also non-volatile or battery-backed such that data is not required to be reloaded after battery changes. In addition, the memories 16 and 24 may take the form of a chip, a hard disk, a magnetic disk, and/or an optical disk without limitation.

For commanding the operation of home appliances of different makes, models, and types, the memory 16 may include a command code library. The command code library is comprised of a plurality of command codes that may be transmitted from the universal remote control device 10 for the purpose of controlling the operation of a home appliance. The memory 16 may also includes instructions which the microprocessor 14 uses in connection with the transmission circuit 22 to cause the command codes to be transmitted in a format recognized by an identified home appliance. While the transmission circuit 22 preferably utilizes infrared transmissions, it will be appreciated that other forms of wired or wireless, such as radio frequency, transmissions may also be used. Similarly, the I/O circuitry 32 can allow for wired or wireless communications (RF or IR) using any conventionally available communications protocol without limitation.

To identify home appliances by type and make (and sometimes model) such that the universal remote control device 10 is adapted to transmit recognizable command codes in the format appropriate for such identified home appliances, data may be entered into the universal remote control device 10. Since methods for setting up a remote control to control the operation of specific home appliances are well-known, it will not be described in greater detail herein. Nevertheless, for additional information pertaining to remote control setup, the reader may turn to U.S. Pat. Nos. 5,614,906 and 4,959,810 which are incorporated herein by reference in their entirety.

To cause the universal remote control 10 to perform an action, the universal remote control device 10 is adapted to be responsive to events, such as a sensed user interaction with one or more keys on the key matrix 18, with the touch screen display 30, or a signal from an external source such as a remote computer. More specifically, in response to an event, appropriate instructions within the memory 16 are executed. For example, when a hard or soft command key is activated on the universal remote control device 10, the universal remote control device 10 may read the command code corresponding or assigned to the activated command key from the memory 16 and transmit the command code to a home appliance in a format recognizable by the home appliance. It will be appreciated that the instructions within the memory 16 can be used not only to cause the transmission of command codes to home appliances but also to perform local operations. While not limiting, local operations that may be performed by the universal remote control device 10 include favorite channel setup, macro button setup, command function key relocation, etc. Examples of local operations can be found in U.S. Pat. Nos. 5,481,256, 5,959,751, 6,014,092, which are incorporated herein by reference in their entirety.

The platform illustrated in the block diagram of FIG. 1 comprises a general purpose, processor system which is controllable by software. The software may include routines, programs, objects, components, and/or data structures that perform particular tasks that can be viewed as an operating system together with one or more applications. The operating system, such as the "Windows CE" brand operating system or the like, provides an underlying set of management and control functions which are utilized by the applications to offer user functions such as control of home appliances. In further embodiments, applications can be provided for use in accessing Internet data, displaying TV guide information, and the like. It should be understood that, while the term "remote control" is used herein to designate the physical unit, in terms of the internal software architecture the conventional "clicker" remote control user interface is but one of several possible applications which may co-exist within the universal remote control device 10.

Figure 2:
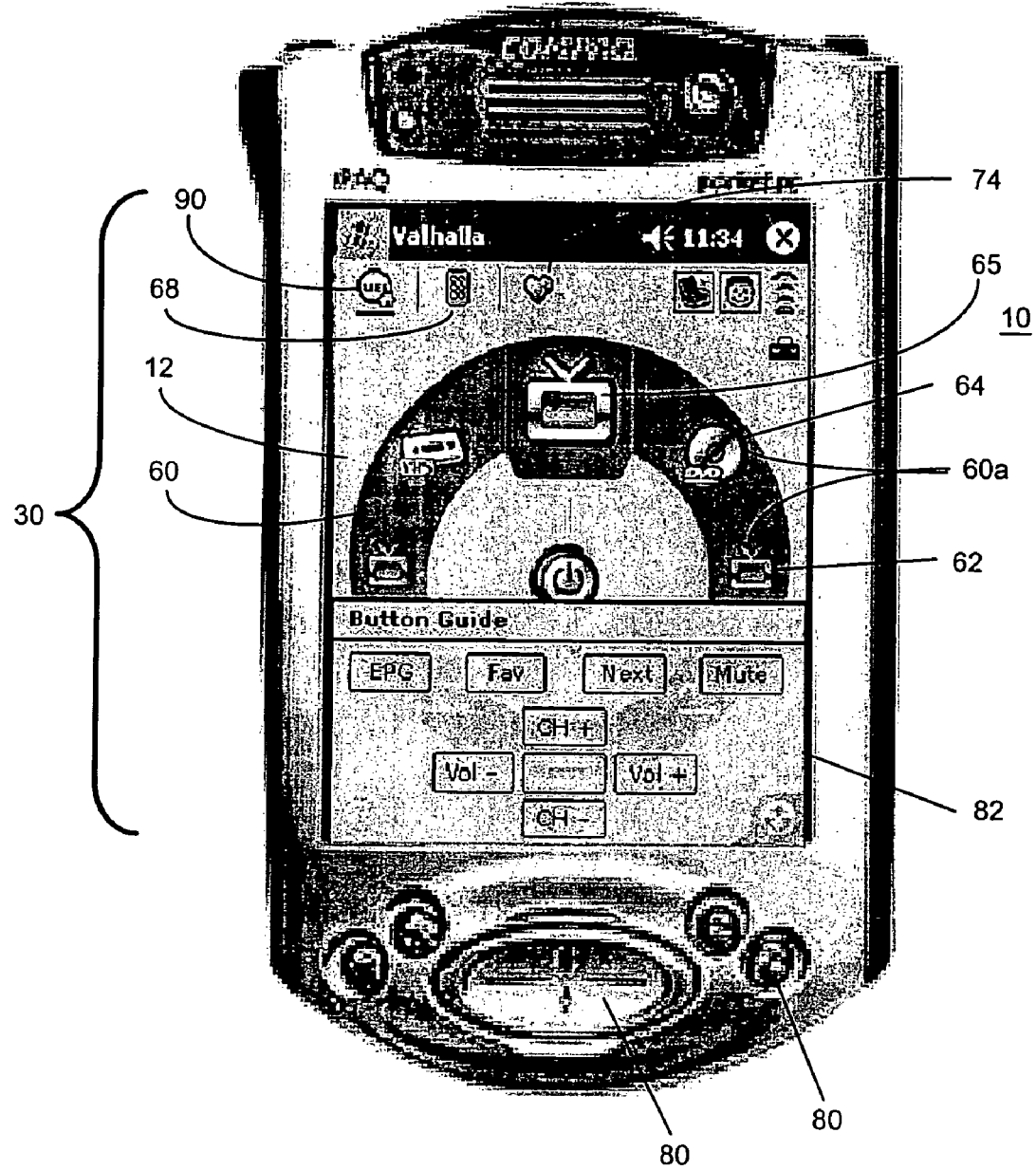
FIG. 2 illustrates a top elevational view of a universal remote control including a graphical user interface with an exemplary pop-up screen constructed in accordance with the subject invention.

FIG. 2 illustrates an exemplary appearance of a graphical user interface 12 displayed on an LCD touch screen 30 by which a user inputs events into the universal remote control device 10 to control the operation of the universal remote control device 10. For customizing the universal remote control device 10, a setup application may be invoked. Customization can be provided using menu-driven applications which cooperate with the graphical user interface application to provide a user with the means to enter setup information. For example, a device setup application can be used to provide the user with the opportunity to access all of the infrared control codes required for operation of an entire home electronics system. Control codes may be pre-stored in the memory 16 and/or memory 24, learned into the memory 24 by using a remote control that was supplied with a home appliance, or downloaded from a remote source, e.g., from a source via the Internet, and loaded into memory 24.

To select control codes to be available for controlling home appliances by device type and manufacturer, a setup by brand application may be utilized. This application is based in part on technology disclosed in U.S. Pat. No. 5,614,906 entitled "Method for selecting a remote control command set" that is incorporated herein by reference in its entirety. A setup by search application permits the user to select control codes by linearly stepping through a database of codes by device type, trying each one in turn. A setup by code application permits the user to simply enter a known code number to configure the universal remote control device 10 to make accessible the control codes to control the device(s) corresponding to the known code number. A new code application allows the user to try new codes received during a prior download over a network connection, through customer service via the telephone, etc. Since all of these means for setting up a remote control to control a given home appliance are well understood by those of ordinary skill in the art, they will not be discussed in greater detail herein for the sake of brevity.

For displaying to the user the home appliances which the universal remote control device 10 has been setup to control, the graphical user interface 12 provides for the display of circular queue of device modes, preferably in the form of a wheel 60. It will be appreciated that the circular queue can have other display arrangements (such as linked, linearly displayed lists) provided there is no start or end to the list. In a preferred embodiment, the mode wheel 60 has place holders 60a which are used to display iconic representations of the home appliances the universal remote control device 10 is setup to control. The place holders 60a may display a generic grayed out icon 62 when a place holder 60a is available, i.e., the icons function to inform that the universal remote control device 10 can be setup to control an additional home appliance. When the universal remote control device 10 is setup to control a particular home appliance, the generic grayed out icon 62 representative of an empty place holder 60a is replaced by an iconic representation 64 of the home appliance the universal remote control device 10 was just setup to control the operation of. It will be understood that the number of home appliances the universal remote control 10 can be setup to control and, accordingly, the number of place holders 60a in the mode wheel 60, are a matter of manufacturer's choice.

While not intended to be limiting, it is contemplated that the universal remote control device 10 will be able to control home appliances such as TVs, VCRs, CD players, DVD players, personal computers, digital video recorders, lighting, window fixtures, thermostats, home alarm systems, etc. Accordingly, within the memory 24 may be stored images that will be used when displaying the iconic representation 62 of a home appliance the universal remote control device 10 is setup to control. It will be understood that these images could be provided at the time of manufacture of the universal remote control device 10 or could be downloadable into the memory 24 from an external source. Accordingly, since multiple images may be available for use when displaying the iconic representation 64, the user may be provided with the ability to use the graphical user interface 12 to select which image the user would like to include in the mode wheel 60 as the universal remote control device 10 is being setup to control a home appliance.

To select which home appliance the user desires to control, the user need only touch the display 30 over the iconic representation 64 of the intended target home appliance. In response to this event, the graphical user interface 12 will cause the mode wheel 60 to move (in the illustrated case it will rotate) until the selected iconic representation 64 is displayed at a predetermined location within the circular queue, for example, at the top of the mode wheel 60. During the rotation of the mode wheel 60, the operating software of the universal remote control device 10 will simultaneously place the universal remote control device 10 in the mode appropriate for controlling the operation of the indicated home appliance. It will be appreciated that this mode of operation may still allow the universal remote control device 10 to transmit commands for controlling the operation of other home appliances if the universal remote control device 10 was preprogrammed or setup to perform these operations in this, or additional, modes (e.g., if setup to perform volume/channel punch through, to transmit macros, etc.).

For indicating to the user which mode the universal remote control device 10 is currently in, it is preferred that the iconic representation of the home appliance be provided with a unique location within the mode ring 60 (in this example the top of the ring). Furthermore, or alternatively, the iconic representation may be provided with a unique appearance relative to the remaining iconic representations. Thus, the iconic representation corresponding to the current mode of the universal remote control device 10 may be displayed with an enlarged size at the top of the mode wheel 60 relative to the display size of the other icons in the mode wheel 60. To further enhance the noticability of changes in mode, the iconic representations may gradually achieve any distinct appearance as the icons are moved towards the predetermined location. In this case, the iconic representations grow as they are moved towards the top of the mode wheel 60 and shrink as they are moved away from the top of the mode wheel 60. While not necessary, the increasing, decreasing procedures may be performed at a rate such that all iconic representations other than the iconic representation in the predetermined location have the same relative sizes.

Figure 4:
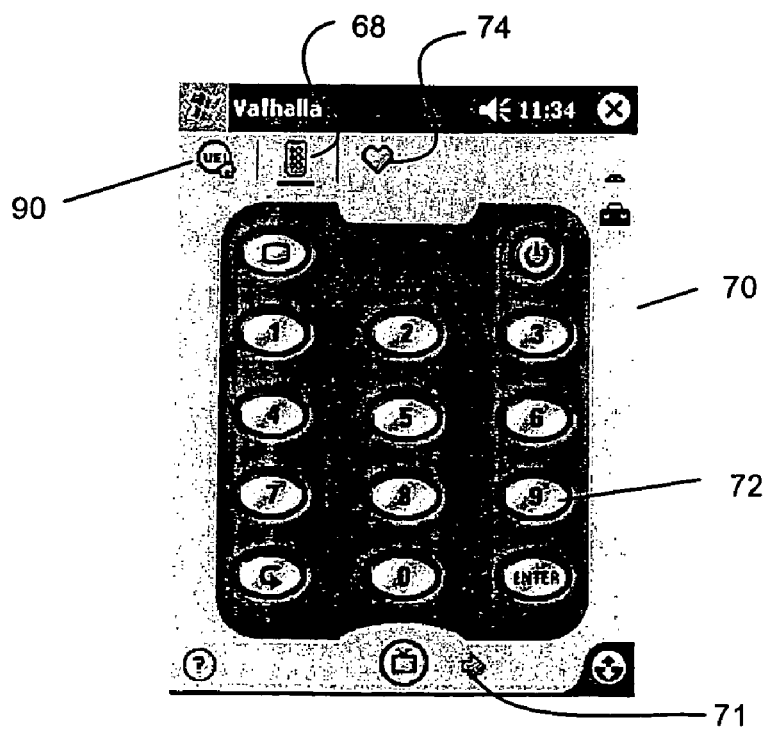
FIG. 4 illustrates an exemplary numerical soft key panel for use in connection with the graphical user interface shown in FIG. 2.

For further enhancing the ease of use of the universal remote control device 10, the graphical user interface 12 may provide a remote control icon 68 which allows the user to command the universal remote control device 10 to display a panel 70 that includes soft keys 72 used to command operations of the home appliance of the current mode of operation as illustrated in FIG. 4. The panel 70 can be a pop-up window, a stand-alone window, or the like. Furthermore, multiple panels 70 can be provided. In this case, it is preferred that only one panel 70 be displayed and the user be provided with a means, such as arrows 71, whereby a user may select to navigate between panels 70.

By way of example only, as illustrated in FIG. 4, if the current mode of operation is television, in response to a user selecting the remote control icon 68, by touching the display 30 over the remote control icon 68, the graphical user interface 12 of the universal remote control device 10 will cause a panel 70 to be displayed having soft keys 72 for use in commanding the operation of a television, e.g., channel numbers for use in tuning the device, a power key, etc. It will be appreciated that, if the user selects a displayed soft key 72 such as, by way of example, touching the display 30 over the soft key 72, the universal remote control device 10 will transmit a command code appropriate for commanding the operation of the home appliance represented by the displayed soft key 72. Furthermore, it may be desirable to display in the panel 70 a virtual representation of a remote control having soft keys such that the arrangement and appearance of the soft keys mimic the arrangement and appearance of the keys of the remote control that is normally shipped with the target home appliance.

For allowing a user to display favorite operations, the graphical user interface may provide a selectable favorite icon 74. Selecting the favorite icon 74 would cause the graphical user interface 12 to display a favorites panel 76 which may have been setup by the user in a known manner to display iconic representations 78 the selection of which results in the transmission of defined command codes. Again, more than one favorites panel 76 may be provided and the user can be given a means 77 to navigate between the multiple favorites panels 76. Preferably, each mode of operation has a unique favorites panel 76 that is displayable to the user.

Figure 5:
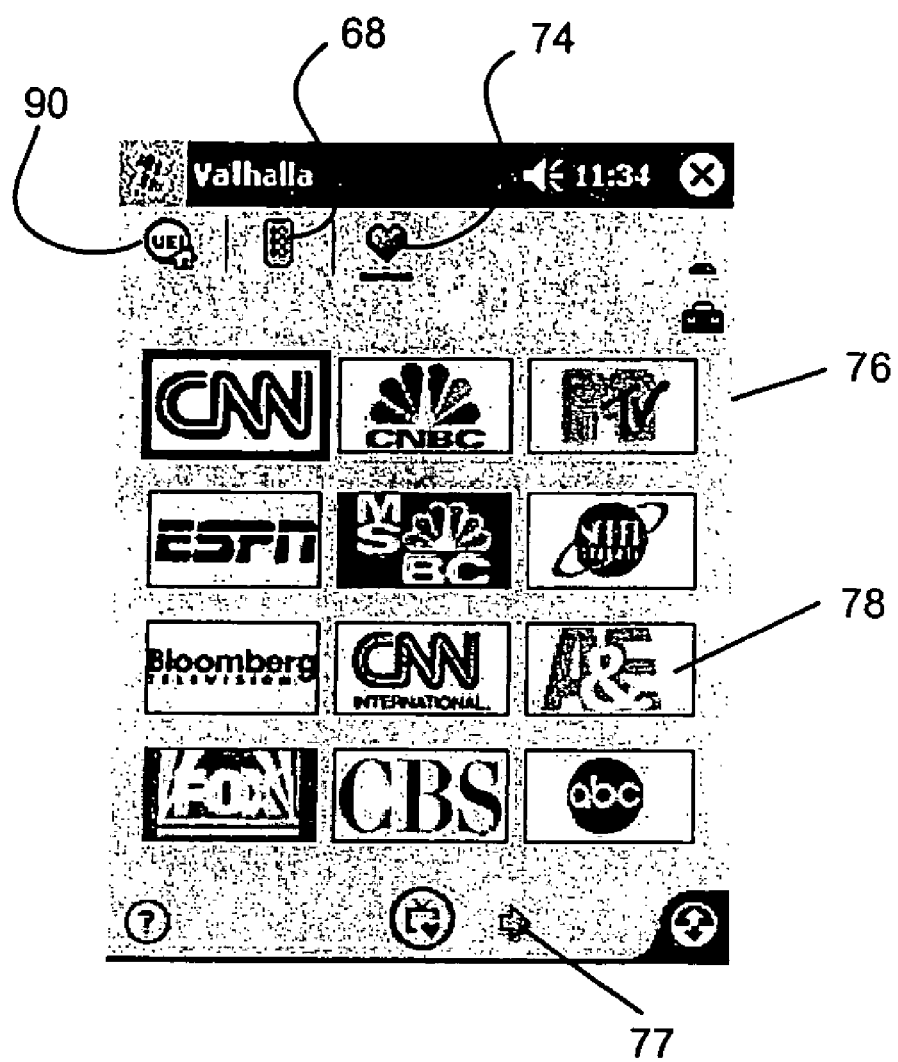
FIG. 5 illustrates an exemplary soft key panel using representations of television station logos for use in connection with the graphical user interface shown in FIG. 2.

By way of example, FIG. 5 illustrates a television mode favorites panel 76 in which iconic representations 78 of user setup (or preprogrammed) favorite television channels is displayed. Each iconic representation 78 is associated with a macro. When an iconic representation 78 is selected, the universal remote control device 10 will issue the appropriate commands to cause the target home appliance to tune to a given channel.

In addition to the device control panel screens, basic functions for the currently selected device mode can be made available directly from the home or other panels. By way of example, referring to FIG. 3, a direct control icon 78, illustrated as a power key in the center of the display, can be selected by a user to cause the transmission of a defined control code. In this case, the control code would be the control code for controlling the TV power operation (since power is being represented by the appearance of the direct control icon 78 and television is the current mode of operation).

Figure 3:
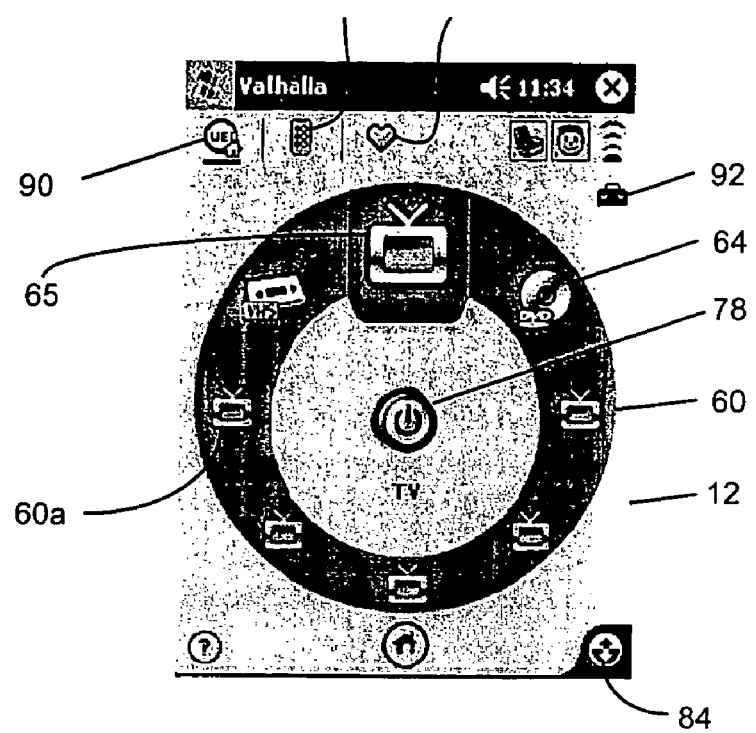
FIG. 3 illustrates an exemplary home screen for use in connection with the graphical user interface shown in FIG. 2.

Any hard keys 80 available on the universal remote control device 10 can also have command codes mapped thereto such that activation of the hard keys 80 can be used to control common functions of a home appliance, such as volume and channel (or may be volume and play/pause if a DVD or VCR is the selected mode of operation). Since the control button functions could vary depending on the particular hardware platform and device mode selected, the system provides for a platform-specific "pop-up" graphic overlay 82, as illustrated in FIG. 2, which functions to show the user what commands are assigned to the hard keys 80 of the specific platform. The graphics overlay 82 can be accessed, for example, by touching the icon 84 shown at the very bottom of the screen as illustrated in FIG. 3. These graphics overlay preferably does not include selectable "buttons" which, when selected, cause the transmission of command codes. Rather, the graphics overlay should merely show what functions are assigned to the hard keys.

As will be appreciated, all of the iconic representation described herein can be predetermined at the time of manufacture, can be user alterable, and/or can be downloadable. Furthermore, a home icon 90 can be provided which, when selected by a user, will cause the graphical user interface to return to a predetermined display. Still further, a setup icon 92 can be provided which, when selected by a user, will cause the graphical user interface to display prompts for use in setting-up and configuring the universal remote control device 10.

As noted previously, the universal remote control device 10 is preferably upgradeable whereby additional control codes, iconic representations, or the like, can be downloaded to the universal remote control device 10 by connecting the universal remote control device 10 directly to an external device or indirectly to a server via the Internet, via a cable set top box, etc. The ability to upgrade the remote control may be based on technology disclosed in U.S. Pat. No. 5,537,463 entitled "Magnetic modem in a remote control," U.S. Pat. No. 5,228,077 entitled "Remotely upgradable universal remote control" and in U.S. Pat. No. 5,689,353 entitled "Remote control with two-way data coupling" that are incorporated herein by reference in their entirety.

When used in connection with a platform having an enlarged display and Web browsing capabilities, such as a Web tablet, the universal remote control device 10 can be configured such that each of the mode wheel 60, soft key panel(s) 70, and favorite key panel(s) 76 are simultaneously displayed to the user. As will be appreciated, changing the current mode using the mode wheel 60 will result in a change in the soft key panel(s) 70 and favorite key panel(s) 76 that are displayed to the user.

Figure 6:
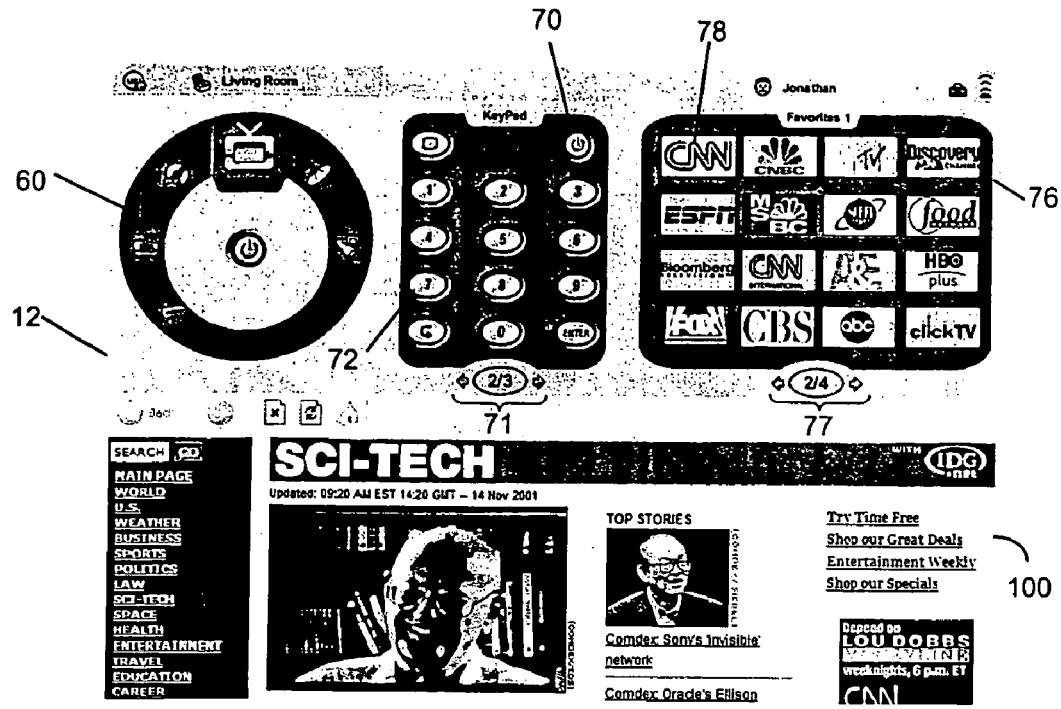
FIG. 6-8 illustrate further exemplary uses of Web browsing capabilities provided with a universal remote control having an enlarged viewing display.
Figure 8:
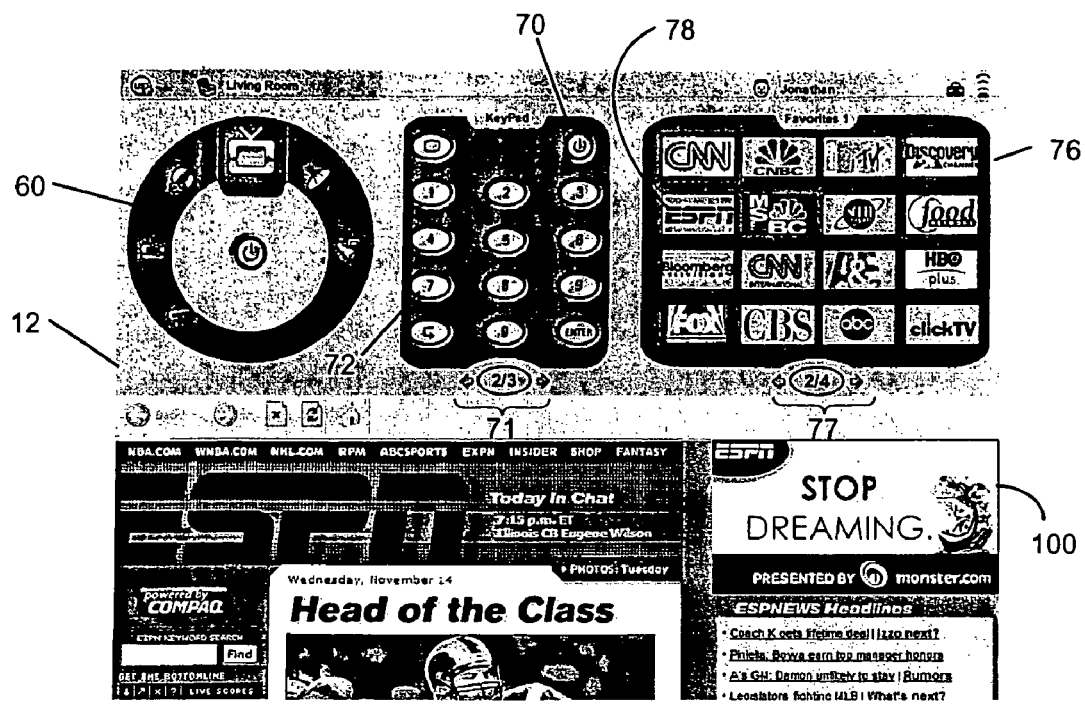

In one embodiment, illustrated in FIGS. 6 and 8, the universal remote control device 10 is configured such that selection of an icon 78 in the favorites panel 76 will not only cause the controlled device to access the favorite (channel, track, etc.), but simultaneously invoke the browser to retrieve Web content associated with the selected favorite. To this end, when setting up the universal remote control device 10, a URL for directing the browser to the Web content related to the favorite 100 is associated with the icon 78. In this manner, when the icon 78 is selected, the URL is read by the browser which uses the URL to retrieve the Web content. The URL can be setup by the user manually associating a URL with the icon, can be preloaded at the time of manufacture, can be downloaded with the downloading of a graphical representation of the icon 78, etc.

By way of example, in FIG. 6, when a user selects the "CNN" icon while the universal remote control device 10 is in the TV mode, the universal remote control device 10 will transmit the command codes necessary for tuning the TV to the channel on which "CNN" is broadcast and, simultaneously, will cause the browser to retrieve information pertaining to "CNN," for example, Web content at "CNN.com." Similarly, as illustrated in FIG. 8, when a user selects the "ESPN" icon while the universal remote control device 10 is in the TV mode, the universal remote control device 10 will transmit the command codes necessary for tuning the TV to the channel on which "ESPN" is broadcast and, simultaneously, will cause the browser to retrieve information pertaining to "ESPN," for example, Web content at "ESPN.com." It should be appreciated that this feature need not be limited to television viewing and would be applicable to other types of favorites. For example, if the mode of operation is DVD and a particular movie or DVD track is included in the favorites, activation of the icon should cause the universal remote control device 10 to transmit commands to cause the DVD player to start playing the movie or DVD track while it commands the browser to retrieve Web content relevant to the movie title, actors, etc. A similar operation could be performed for albums/music tracks set forth in a CD player favorites panel.

Figure 7:
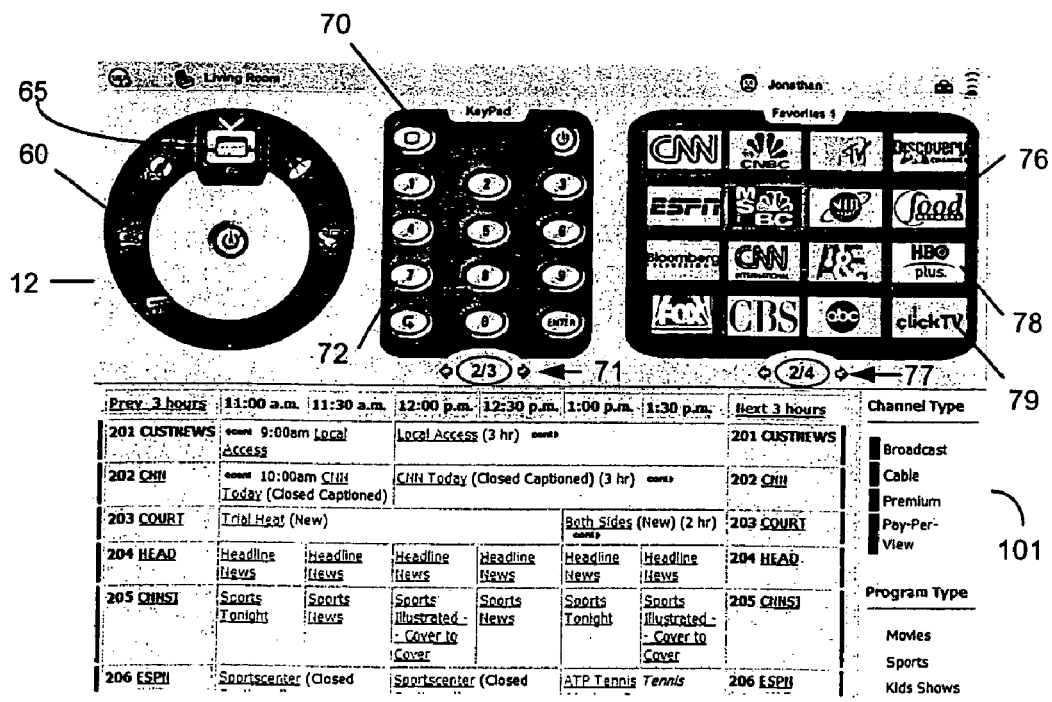

Still further, the universal remote control device 10 could be configured such that Web content is retrieved relative to an entered mode of operation. In this case, a URL would be associated with the mode, using a setup of method similar to that described above, such that, in response to entering a mode of operation, the universal remote control device 10 can cause the browser to retrieve Web content relevant to the use of the device to be commanded. For example, as illustrated in FIG. 7, when the universal remote control device 10 is placed into the television mode, the browser can use a URL to retrieve Web content 101 having television guide information.

Figure 9:
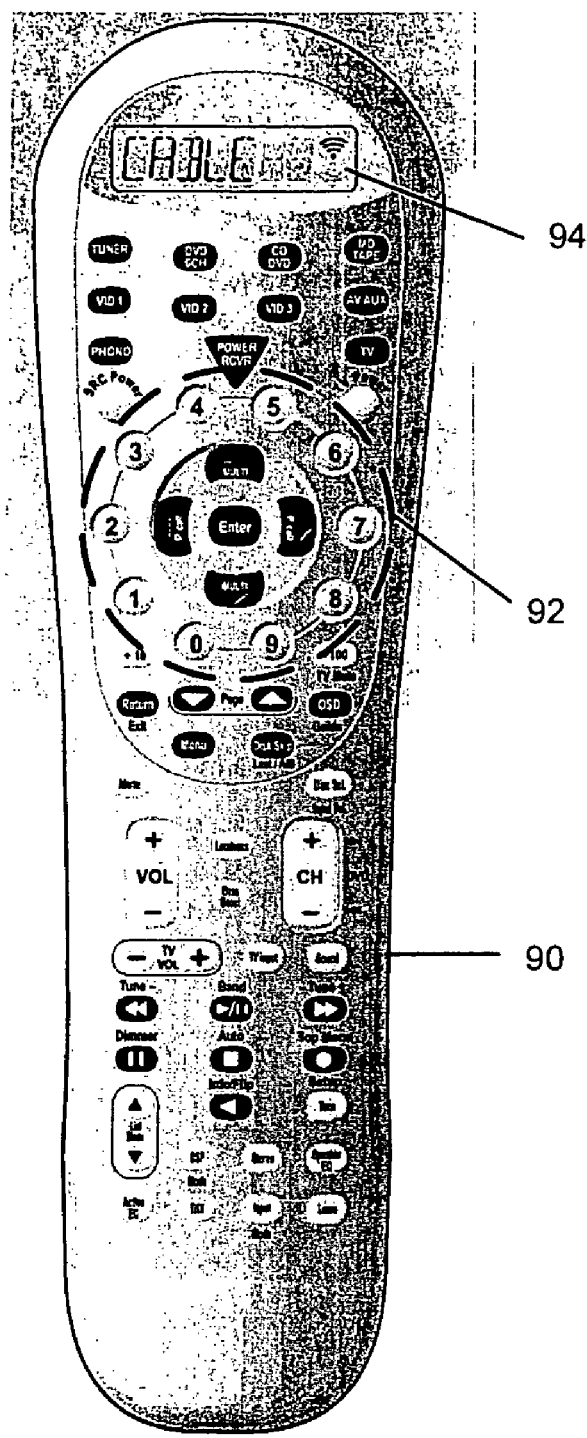
FIG. 9 illustrates an exemplary use of the circular queue metaphor in connection with hard keys of a remote control.

While specific embodiments of the invention have been described in detail, it will be appreciated by those skilled in the art that various modifications and alternatives to those details could be developed in light of the overall teachings of the disclosure. By way of example, FIG. 9 illustrates a remote control 90 having hard keys 92 arranged using the wheel metaphor. While not intended to rotate, the hard keys 92 can be presented using a further, familiar metaphor, e.g., a telephone rotary dial, to further ease use. The remote control 90 may also have a display 94 for displaying information as noted above, e.g., Internet retrieved information, etc. Accordingly, the particular arrangements disclosed are meant to be illustrative only and not limiting as to the scope of the invention which is to be given the full breadth of the appended claims and any equivalents thereof.

What is claimed is:

1. A method of using a remote control to provide relevant content to a user, comprising:

displaying to the user a list having a plurality of items wherein each of the plurality of items is associated with one or more devices that can be controlled using the remote control and wherein each of the plurality of items is mapped to a respective one of a plurality of Web content addresses stored within a memory of the remote control;

accepting input by which the user selects one of the plurality of items from the list; and causing the remote control to respond to the input whereupon the remote control is caused to both access at least one command code mapped within the memory of the remote control to the user selected one of the plurality of items for transmission to at least one device setup within the remote control as being associated with the user selected one of the plurality of items and use the one of the plurality of Web content addresses mapped in the memory of the remote control to the user selected one of the plurality of items to cause a retrieval, via the Internet, of Web content which retrieved Web content is displayed in a display of the remote control.

2. The method as recited in claim 1, wherein the plurality of items within the list each corresponds to a media item.

3. The method as recited in claim 2, wherein the at least one command code is used to tune the at least one device to access media item corresponding to the user selected one of the plurality of items.

4. The method as recited in claim 3, wherein the accessed media item corresponding to the user selected one of the plurality of items comprises a television channel.

5. The method as recited in claim 4, wherein the retrieved Web content comprises information relevant to the tuned to television channel.

6. The method as recited in claim 3, wherein the accessed media item corresponding to the user selected one of the plurality of items comprises a recorded media track.

7. The method as recited in claim 1, wherein the plurality of items within the list comprises modes each indicative of one or more devices which the remote control has been setup to control.

8. A method of using a remote control to provide relevant content to a user, comprising:
   displaying to the user a user generated list of items associated with at least one of a plurality of devices to be controlled wherein each of the displayed items is mapped to a respective one of a plurality of Web content addresses stored within a memory of the remote control;
   accepting input by which the user selects one of the items from the list of items; and
   causing the remote control to respond to the input whereupon the remote control is caused to both transmit command codes to the device to be controlled to cause the device to be controlled to access the user selected item and use the one of the plurality of Web content addresses mapped in the memory of the remote control to the user selected item to cause a retrieval, via the Internet, of Web content which retrieved Web content is displayed in a display of the remote control.

9. The method as recited in claim 8, wherein the device to be controlled is a television and the items comprise television broadcast channels.

10. The method as recited in claim 8, wherein the device to be controlled is a recorded media playback device and the items comprise tracks.

11. A method of using a remote control to provide relevant content to a user, comprising:
    displaying to the user a list of modes indicative of devices that can be controlled wherein each of the displayed modes is mapped to a respective one of a plurality of Web content addresses stored within a memory of the remote control;
    accepting input by which the user selects one of the modes from the list of modes; and
    causing the remote control to respond to the input whereupon the remote control is caused to both access command codes capable of controlling a device setup to correspond to the user selected mode and use the one of the plurality of Web content addresses mapped in the memory of the remote control to the user selected mode to cause a retrieval, via the Internet, of Web content which retrieved Web content is displayed in a display of the remote control.

12. The method as recited in claim 11, wherein the Web content comprises television guide listings when the user selected mode places the remote control in a mode for controlling a television.

* * * * *

UNITED STATES PATENT AND TRADEMARK OFFICE
CERTIFICATE OF CORRECTION

PATENT NO. : 7,610,555 B2  Page 1 of 1
APPLICATION NO. : 11/491588
DATED : October 27, 2009
INVENTOR(S) : Klein et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 411 days.

Signed and Sealed this

Twelfth Day of October, 2010

David J. Kappos
*Director of the United States Patent and Trademark Office*